(12) United States Patent
Hsu

(10) Patent No.: US 10,088,503 B2
(45) Date of Patent: Oct. 2, 2018

(54) PROBE CARD

(71) Applicant: Taiwan Semiconductor Manufacturing CO., LTD., Hsinchu (TW)

(72) Inventor: Ming-Cheng Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 487 days.

(21) Appl. No.: 14/192,107

(22) Filed: Feb. 27, 2014

(65) Prior Publication Data

US 2015/0241471 A1    Aug. 27, 2015

(51) Int. Cl.
*G01R 1/073*    (2006.01)

(52) U.S. Cl.
CPC ..... *G01R 1/07371* (2013.01); *Y10T 29/49124* (2015.01)

(58) Field of Classification Search
CPC .................................................. G01R 1/073
See application file for complete search history.

(56) References Cited

U.S. PATENT DOCUMENTS

| 6,174,173 B1 * | 1/2001 | Fukunaga | H05K 7/1053 |
| | | | 439/68 |
| 8,133,061 B1 * | 3/2012 | Ayers, Sr. | H01R 12/714 |
| | | | 439/66 |
| 9,234,917 B2 | 1/2016 | Wu et al. | |
| 2004/0036493 A1 * | 2/2004 | Miller | G01R 1/07314 |
| | | | 324/754.14 |
| 2012/0319711 A1 * | 12/2012 | Hung | G01R 1/07371 |
| | | | 324/750.16 |
| 2013/0099814 A1 | 4/2013 | Kazama et al. | |

FOREIGN PATENT DOCUMENTS

| TW | 200624821 | 7/2006 |
| TW | 201213813 | 4/2012 |
| TW | 201314214 | 4/2013 |

* cited by examiner

*Primary Examiner* — Jermele M Hollington
*Assistant Examiner* — Feba Pothen

(57) ABSTRACT

An apparatus and a method are disclosed herein. The apparatus includes a circuit board, a housing, a spacer and a pin. The circuit board is configured to test a device-under-test (DUT). The housing includes a raised portion and a supporting portion. The spacer is mounted on the supporting portion of the housing. The pin penetrates through the raised portion and the supporting portion of the housing, and is configured to electrically connect the circuit board to the DUT.

20 Claims, 10 Drawing Sheets

PROBE CARD

BACKGROUND

Testing is a key operation of semiconductor fabrication. To facilitate testing on numerous semiconductor devices (e.g., chips or dies) on a wafer at the same time, probe cards are used. A probe card includes probes that correspond to contact pads on the wafer for the semiconductor devices.

Each of the semiconductor devices has contact pads accessed for testing. To allow for more contact pads connected to the semiconductor devices, wafer level chip scale package (WLCSP) was developed. In the WLCSP technology, the semiconductor device is packaged on the wafer level. By using the WLCSPs and the probe cards, the semiconductor devices are tested more effectively with an automated test equipment (ATE).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
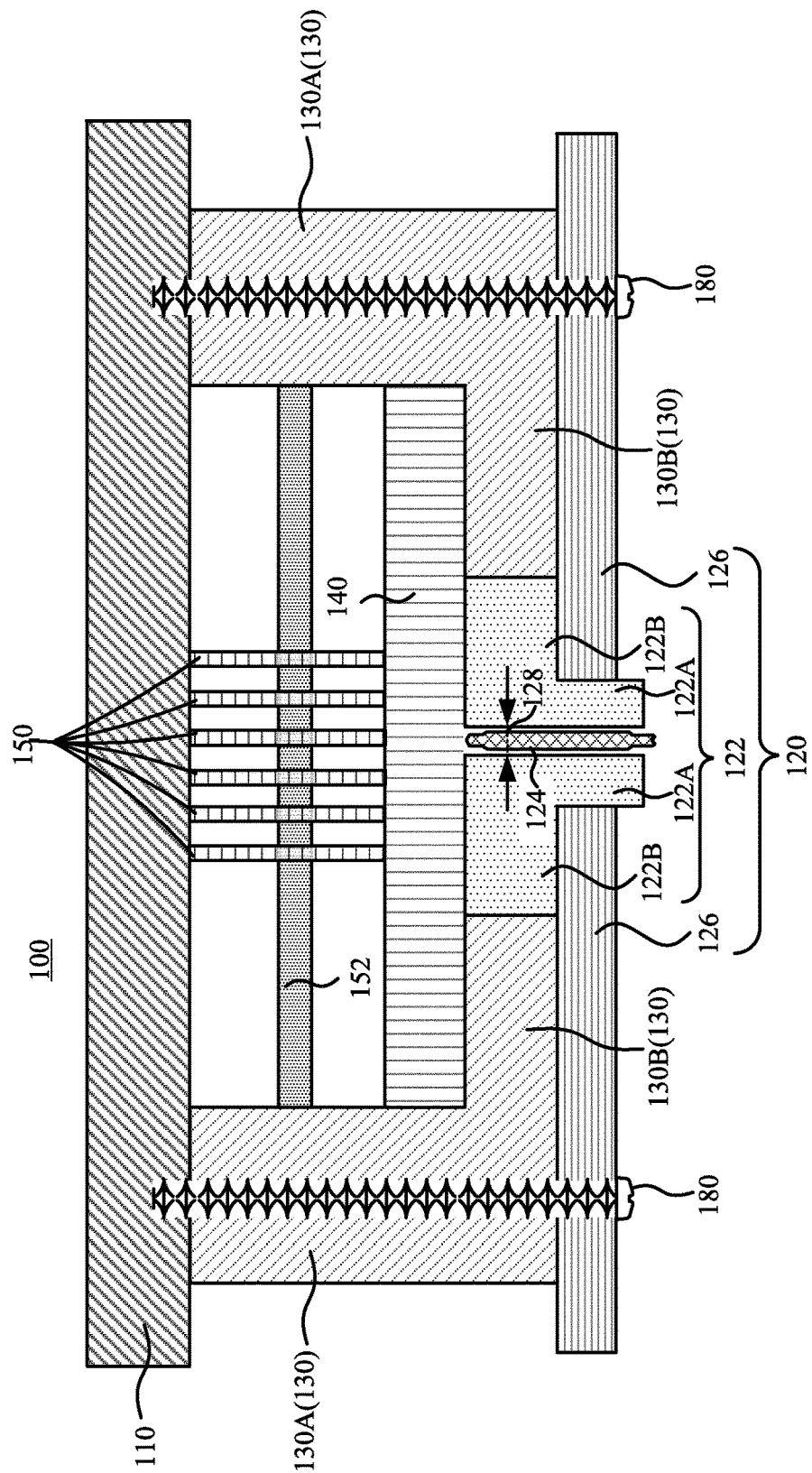
FIG. 1A is a cross-sectional view of a probe card in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1A is a cross-sectional view of a probe card 100 in accordance with various embodiments of the present disclosure. In some embodiments, the probe card 100 is configured to test functionality of devices-under-test (DUTs). In some embodiments, the DUTs include semiconductor devices, chips, or dies with contact pads on a wafer.

As shown in FIG. 1A, the probe card 100 includes a circuit board 110, a probe head 120, a fixture 130, a substrate 140, interposers 150, and fixed parts 180. The circuit board 110 is configured to test the DUTs. In some embodiments, the circuit board 110 is a printed circuit board (PCB) having certain testing circuits. In some other embodiments, the circuit board 110 connects the DUTs to an automatic testing equipment (ATE) for testing.

The probe head 120 includes a housing 122, a pin 124 and a spacer 126. The housing 122 is disposed on the circuit board 110. In some embodiments, the housing 122 is made of a single-piece of ceramic material. For illustrative purposes, one pin 124 is illustrated in FIG. 1A. Various numbers of the pin 124 in FIG. 1A is within the contemplated scope of the present disclosure.

The housing 122 includes a raised portion 122A, which is relatively higher than the spacer 126, and a supporting portion 122B. The housing 122 further includes a through-hole 128 passing through the raised portion 122A and the supporting portion 122B. The pin 124 is disposed in the through-hole 128 and penetrates the housing 122 to be connected to the DUTs. In other words, the DUTs are able to be electrically connected to the probe card 100 via the pin 124 for testing. The spacer 126 is mounted on the supporting portion 122B of the housing 122. The spacer 126 is configured to secure the housing 122 onto the circuit board 110.

The fixture 130 is disposed between the circuit board 110 and the spacer 126. The fixture 130 is configured to support the spacer 126. For illustration, the fixture 130 includes a first portion 130A and a second portion 130B. The first portion 130A of the fixture 130 is disposed between the circuit board 110 and the spacer 126. The second portion 130B of the fixture 130 is disposed between the substrate 140 and the spacer 126. The first portion 130A of the fixture 130 and the spacer 126 are secured on the circuit board 110 through fixed parts 180.

The substrate 140 is disposed between the housing 122 and the circuit board 110 to support the housing 122. The second portion 130B of the fixture 130 and the supporting portion 122B of the housing 122 are sandwiched between the substrate 140 and the spacer 126. The substrate 140 is configured to be connected to the pin 124 and the circuit board 110. For illustration, the substrate 140 includes contact pads (not shown), which are configured to provide connecting paths for the pin 124 and the circuit board 110.

The interposers 150 are disposed between the substrate 140 and the circuit board 110. Each of interposers 150 is aligned in parallel to each other. In some embodiments, the probe card 100 further includes a membrane 152. The membrane 152 is configured to keep the interposers 150 being in the parallel alignment. The membrane 152 is optional with the implementations of the interposers 150. The interposers 150 are configured to connect the substrate 140 with the circuit board 110. As shown in the FIG. 1A, the interposers 150 are pressed by the substrate 140. The contact pads (not shown) on the substrate 140 and the contact pads (not shown) on the circuit board 110 are thus electrically connected.

The pin 124 and the interposers 150 in FIG. 1A are given for illustrative purposes. Various numbers and configurations of the pin 124 and the interposers 150 in FIG. 1A are within the contemplated scope of the present disclosure.

Figure 1B:
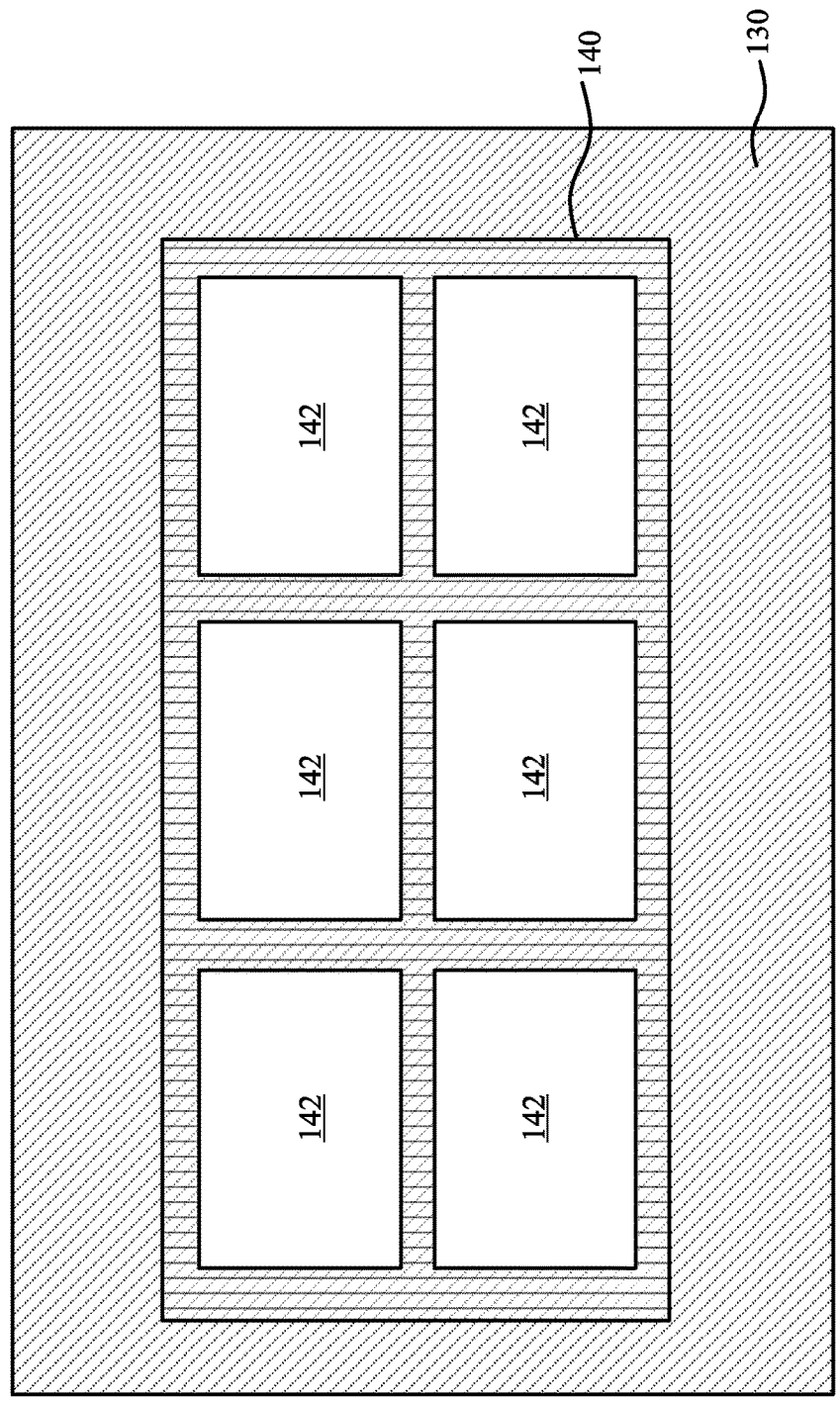
FIG. 1B is a top view of a substrate used for testing multi-DUT and the fixture in the probe card in FIG. 1A, in accordance with various embodiments.
Figure 1C:
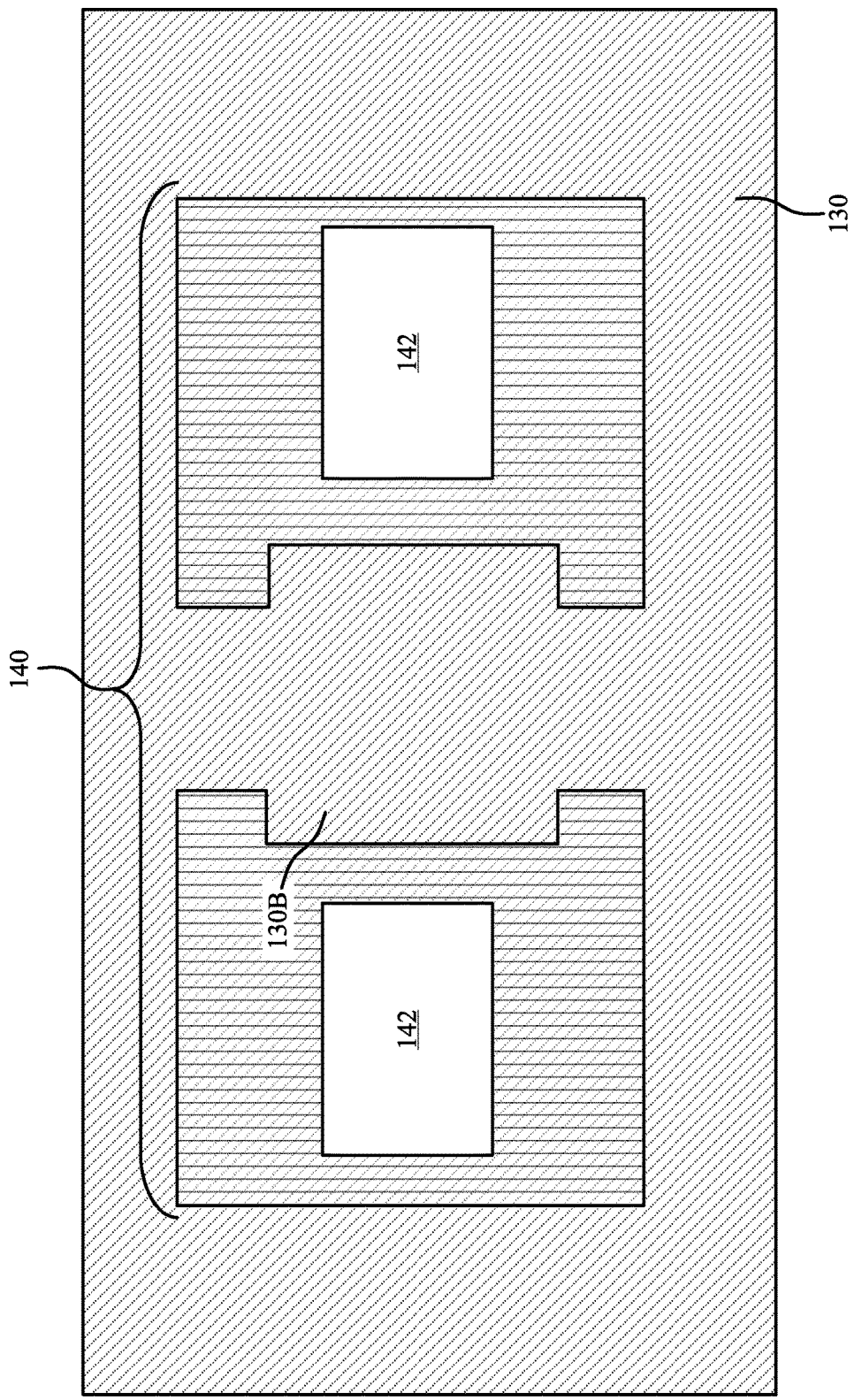
FIG. 1C is a top view of individual substrates and the fixture in the probe card 100 in FIG. 1A in accordance with various embodiments.

FIG. 1B is a top view of a substrate 140 used for testing multi-DUT and the fixture in the probe card 100 in FIG. 1A, in accordance with various embodiments. FIG. 1C is a top view of individual substrates and the fixture 130 in the probe card 100 in FIG. 1A in accordance with various embodiments.

In some embodiments, as shown in FIG. 1B, the substrate 140 is a multi-DUT substrate including sub-areas 142. Each of the sub-areas 142 corresponds to a group of pins 124 illustrated in FIG. 1A, for testing a corresponding DUT. Thus, the multi-DUT substrate is able to test a number of DUTs at the same time. As a result, costs and testing time are reduced.

Alternatively, in further embodiments, as shown in FIG. 1C, the substrate 140 includes individual substrates. As shown in FIG. 1C, the individual substrates are able to be secured by the second portion 130B of the fixture 130. Each of the individual substrates is configured to be connected to a corresponding DUT for testing.

In addition, the structure and the arrangement of the probe head 120 in FIG. 1A are given for illustrative purposes. Various numbers and configurations of the probe head 120 in FIG. 1A are within the contemplated scope of the present disclosure.

Figure 1D:
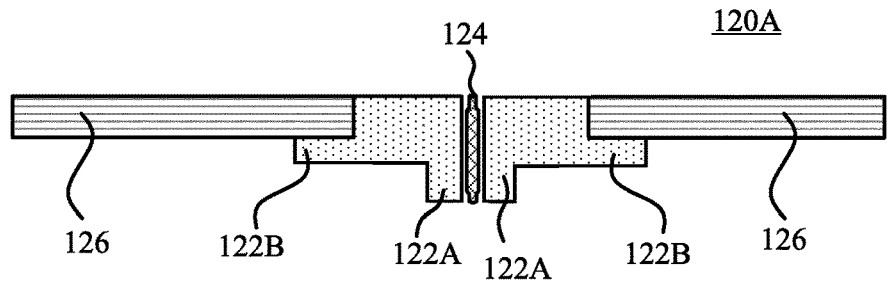
FIG. 1D is a cross-sectional view of a probe head 120A in accordance with various embodiments.
Figure 1E:
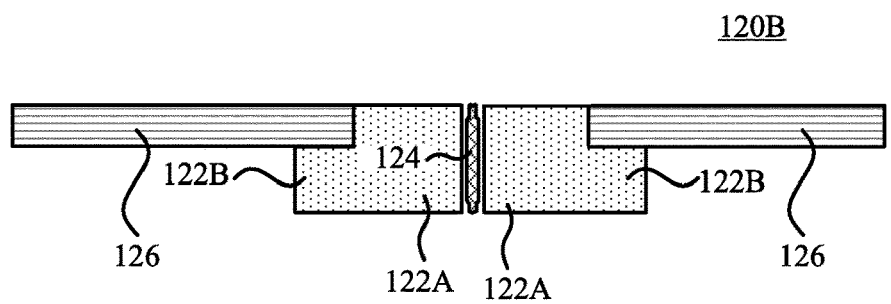
FIG. 1E is a cross-sectional view of a probe head 120B in accordance with various embodiments.
Figure 1F:
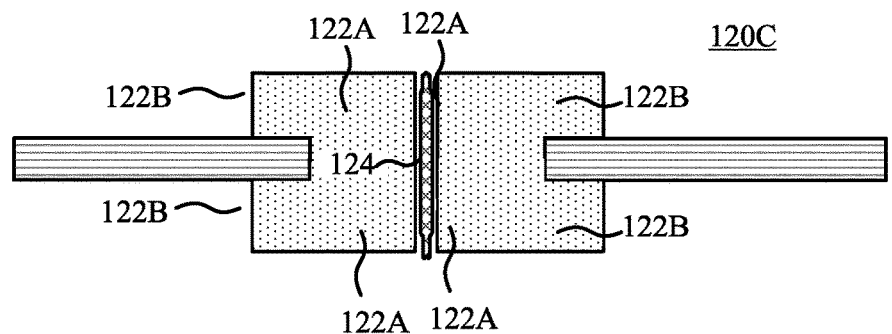
FIG. 1F is a cross-sectional view of a probe head 120C in accordance with various embodiments.

FIG. 1D is a cross-sectional view of a probe head 120A in accordance with various embodiments. FIG. 1E is a cross-sectional view of a probe head 120B in accordance with various embodiments. FIG. 1F is a cross-sectional view of a probe head 120C in accordance with various embodiments.

As shown in FIG. 1D to FIG. 1F, the probe head 120A, 120B and 120C with different arrangements are able to be utilized in the probe card 100 in FIG. 1A. The arrangement of the probe head 120 is able to be adjusted in accordance with the length of the pin 124 and/or requirements in practical applications.

For illustration, if thicknesses of the probe card 100 are determined to be paramount, the probe head 120A is selected and utilized. Alternatively, if stability is determined to be paramount, the probe head 120B and 120C are selected and utilized. The probe head 120B utilizes the supporting portions 122B, which is thicker than supporting portions 122B in FIG. 1D, to support the spacer 126. Further, the probe head 120C utilizes the multiple supporting portions 122B to sandwich the spacer 126. Thus, the reliability and the stability of the probe head 120B and 120C are improved.

Figure 2:
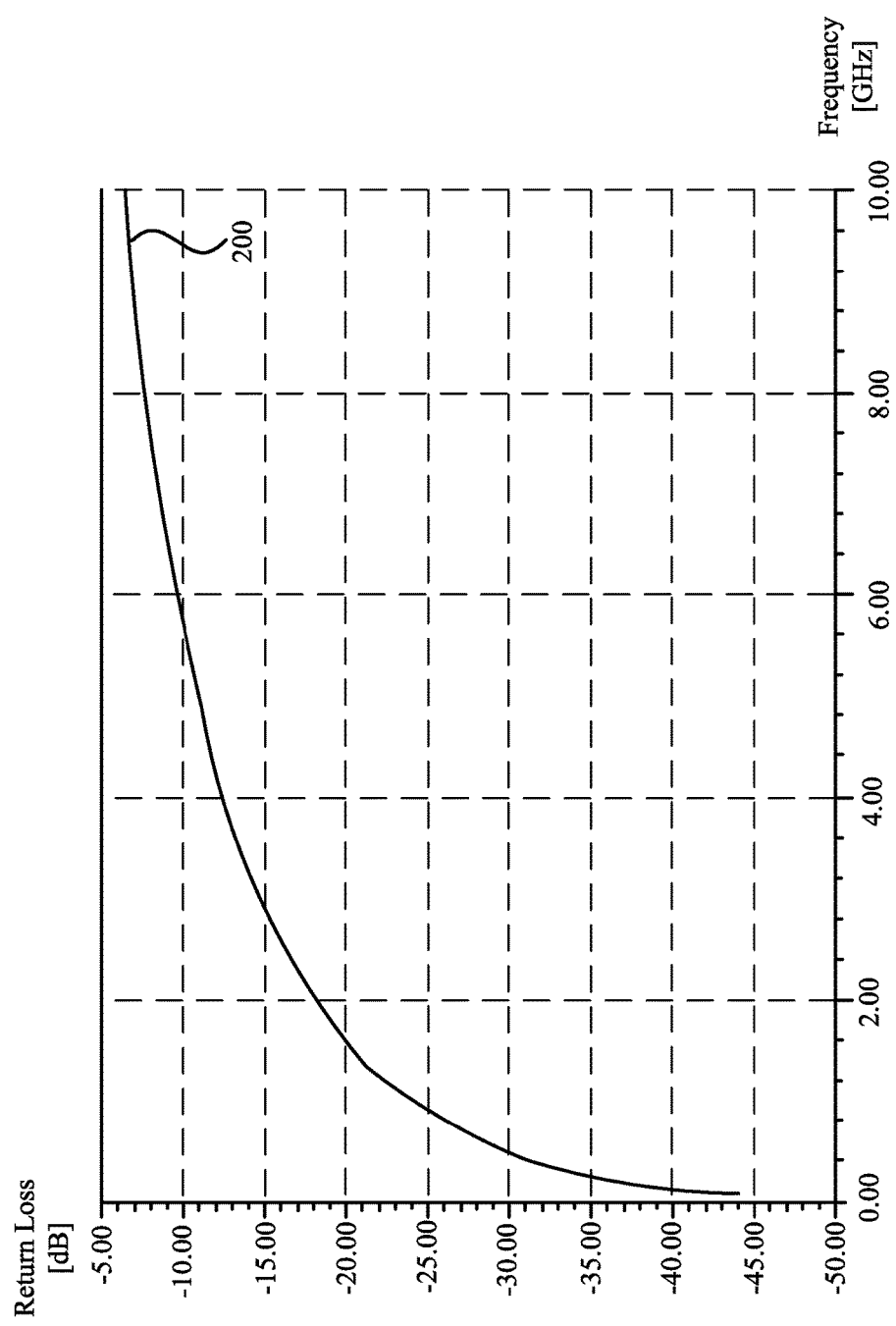
FIG. 2 is a graph illustrating a return loss of the probe card in FIG. 1A in accordance with various embodiments in the present disclosure.

FIG. 2 is a graph illustrating a return loss of the probe card 100 in FIG. 1A in accordance with various embodiments in the present disclosure. Reference is made to FIG. 1A and FIG. 2. With structure of the raised portion 122A of the housing 122, the length of the pins 124 is reduced. Thus, an equivalent resistance of the pin 124, parasitic resistors and parasitic capacitors are reduced. As a result, the bandwidth of the probe card 100 is correspondingly increased.

In some embodiments, the length of the pin 124 is about 2 mm to about 3 mm. In some approaches, the signal paths for testing in the probe cards used in some approaches are too long, which are sufficient to increase the equivalent resistances of the signal paths. As a result, the bandwidth of the probe card is reduced. In general, the length of the signal paths provided from probe cards is dominated by the length of pins. For illustration, the length of the pins in the probe cards used in some approaches is substantially 6.5 millimeters (mm), and the corresponding bandwidth is substantially 1.9 gigahertz (GHZ).

Compared to the preceding approaches, the length of pin 124 is able to be reduced to about 2 mm to about 3 mm with the configuration of raised portion 122A of the housing 122. As a result, the equivalent resistances of the signal paths are reduced, and the bandwidth of the probe card 100 is thus increased.

For illustration, as shown in FIG. 2, a curve 200 indicates the return loss performance of the probe card 100 with the pin 124 having the length of about 3 mm. Compared with the probe cards used in some approaches, the bandwidth of the probe card 100 with the pin 124 having the length of about 3 mm is substantially 6 GHZ. As a result, the bandwidth of the probe card 100 is improved, and the probe card 100 is thus able to be applied for high speed testing.

Figure 3A:
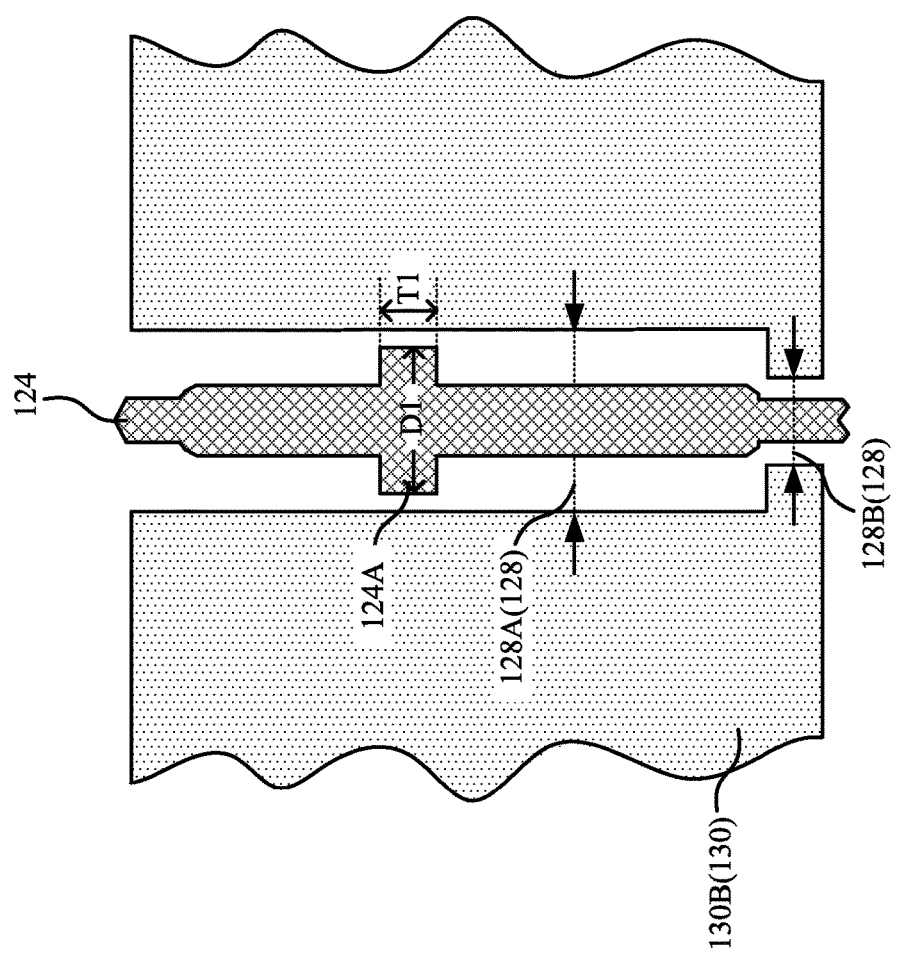
FIG. 3A is a fragmentary enlarged view illustrating a portion of the housing and the pin in FIG. 1A, in accordance with various embodiments of the present disclosure.

FIG. 3A is a fragmentary enlarged view illustrating a portion of the housing 122 and the pin 124 in FIG. 1A, in accordance with various embodiments of the present disclosure.

In some embodiments, as shown in FIG. 3A, the through-hole 128 includes a first portion 128A and a second portion 128B, and the pin 124 includes a stopper 124A. A diameter of the second portion 128B of the through-hole 128 is smaller than the diameter of the first portion 128A of the through-hole 128. The stopper 124A of the pin 124 is configured to contact the boundaries between the first portion 128A and the second portion 128B of the through-hole 128. Explained in a different way, when the pin 124 moves outward from the through-hole 128, the pin 124 is stopped moving by the operation of the second portion 130B (having the second portion 128B of the through-hole 128) blocking the stopper 124A. Thus, the situation of the pin 124 departing from the housing 122 is prevented.

Figure 3B:
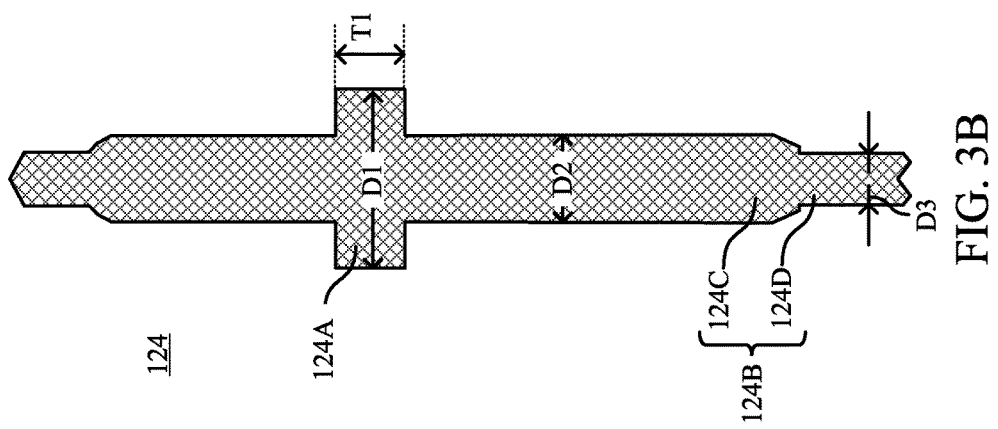
FIG. 3B is a fragmentary enlarged view illustrating of the pin in FIG. 1A, in accordance with various embodiments of the present disclosure.

FIG. 3B is a fragmentary enlarged view illustrating of the pin 124 in FIG. 1A, in accordance with various embodiments of the present disclosure. In some embodiments, as shown in FIG. 3B, the pin 124 includes a plunger 124B. The plunger 124B is connected to the stopper 124A. The plunger 124B includes a first portion 124C and a second portion 124D. In some embodiments, the thickness T1 of the stopper 124A is larger than about 100 micrometers (um), and the diameter D1 of the stopper 124A is longer than the diameter D2 of the first portion 124C of the plunger 124B by about 50 mm. Further, in some other embodiments, the diameter D2 of the first portion 124C of the plunger 124B is longer than the diameter D3 of the second portion 124D by about 30 um.

In some approaches, a thickness T1 and a diameter D1 of the stopper 124A of the pin 124 used are too small, which are sufficient to cause the pin 124 being worn out easily. As a result, the pin 124 shifts away, and damages on the housing 122 and certain probe mark issues on the contact pads of the DUTs are thus caused.

Compared to the preceding approaches, the plunger 124B is applied in the pin 124 in the present disclosure, and the stopper 124A and the plunger 124B are configured as illustrated in the embodiments of FIG. 3B. With larger diameter, the first portion 124C of the plunger 124B has a better wear resistance than the second portion 124D of the plunger 124B. Further, by using a larger thickness and diameter, the stopper 124A is able to be applied for long-term use. As a result, a wear rate of the pin 124 and damages on the housing 122 are reduced, and the reliability of the probe card 100 is improved.

Figure 4:
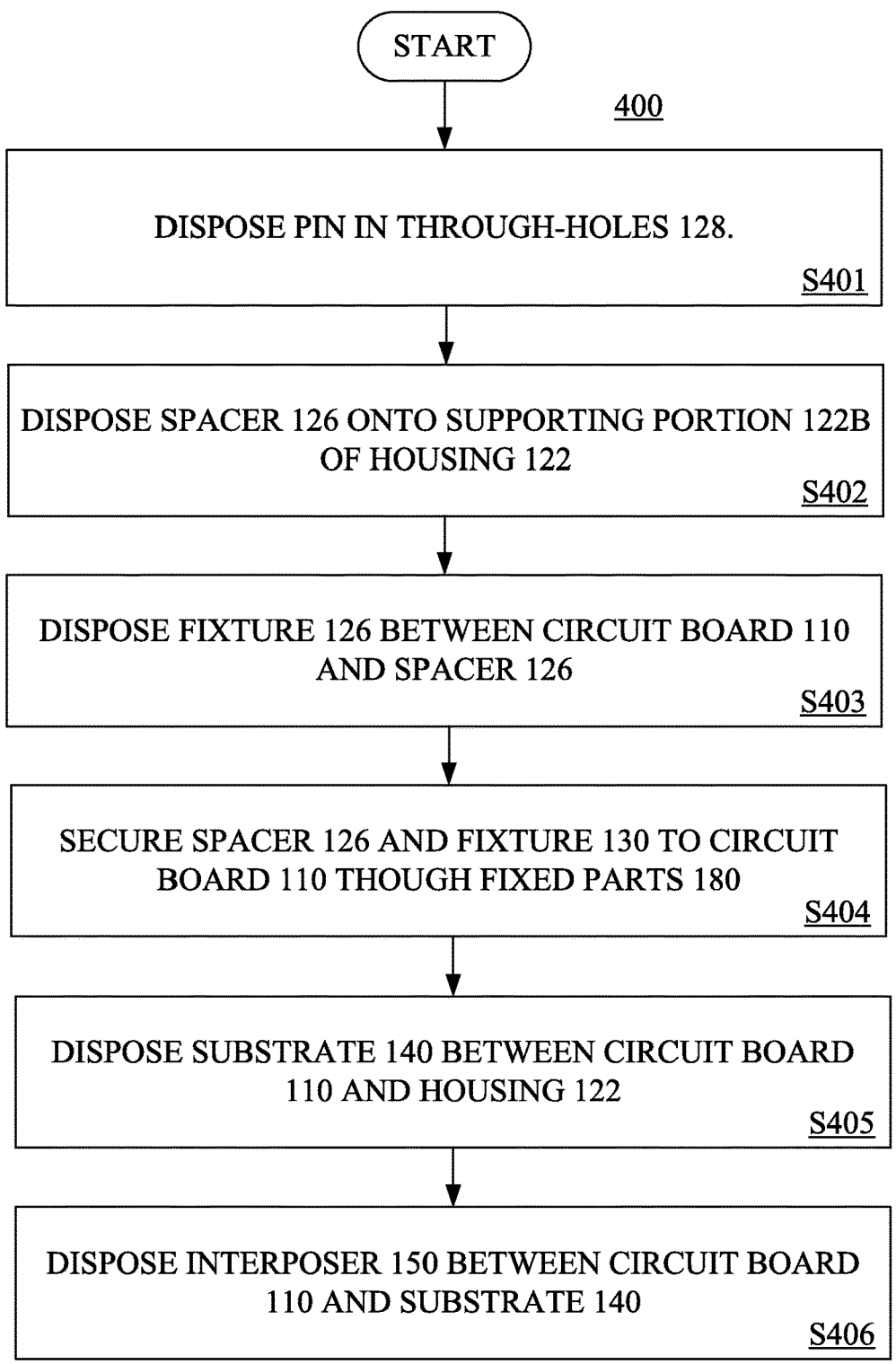
FIG. 4 is a flow chart of a method of manufacturing the probe card in FIG. 1A in accordance with various embodiments of the present disclosure.

FIG. 4 is a flow chart of a method 400 of manufacturing the probe card 100 in FIG. 1A in accordance with various embodiments of the present disclosure. For illustration, the operations of the method 400 in FIG. 4 are described with reference to FIG. 1A.

In operation S401, a pin 124 is disposed in the through-hole 128. The through-holes 128 pass through the raised portion 122A and the supporting portion 122B of the housing 122. In some embodiments, the pin 124 is a pogo pin, which has a length ranging from about 2 mm to about 3 mm. In some embodiments, the housing 122 is made of multi-piece materials. In yet some embodiments, the housing 122 is made of a one-piece material. In some embodiments, the materials include ceramic.

In operation S402, the spacer 126 is disposed onto the supporting portion 122B of the housing 122. In operation S403, the fixture 130 is disposed between the circuit board 110 and the spacer 126.

In operation S404, the spacer 126 and the fixture 130 are secured to the circuit board 110 through fixed parts 180. In some embodiments, the fixed parts 180 include screws. In some other embodiments, the fixed parts 180 include clamps.

In operation S405, the substrate 140 is disposed between the circuit board 110 and the housing 130. In some embodiments, the substrate 140 includes a multi-layer organic (MLO) substrate. In some other embodiments, the substrate 140 includes a multi-layer ceramic substrate. In yet some other embodiments, the substrate 140 includes silicon substrate.

In operation S406, interposers 150 are disposed between the circuit board 110 and the substrate 140. In some embodiments, the interposers 150 include pogo pins, pressure-sensitive and conductive rubbers (PCR) or super buttons. In further embodiments, the interposers 150 include micro electro mechanical systems (MEMS) interposers.

Figure 5A:
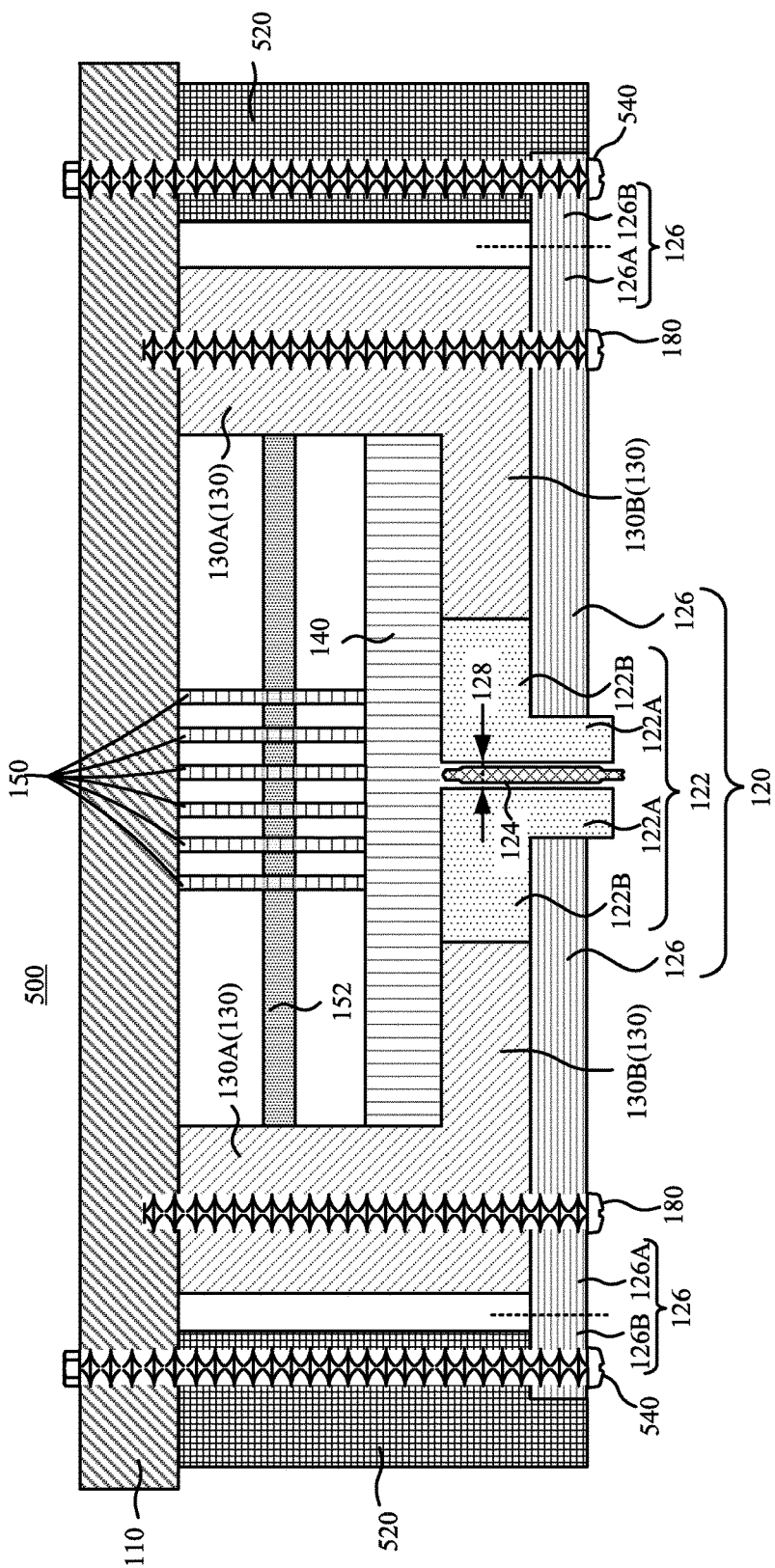
FIG. 5A is a cross-sectional view of a probe card in accordance with various embodiments of the present disclosure.
Figure 5B:
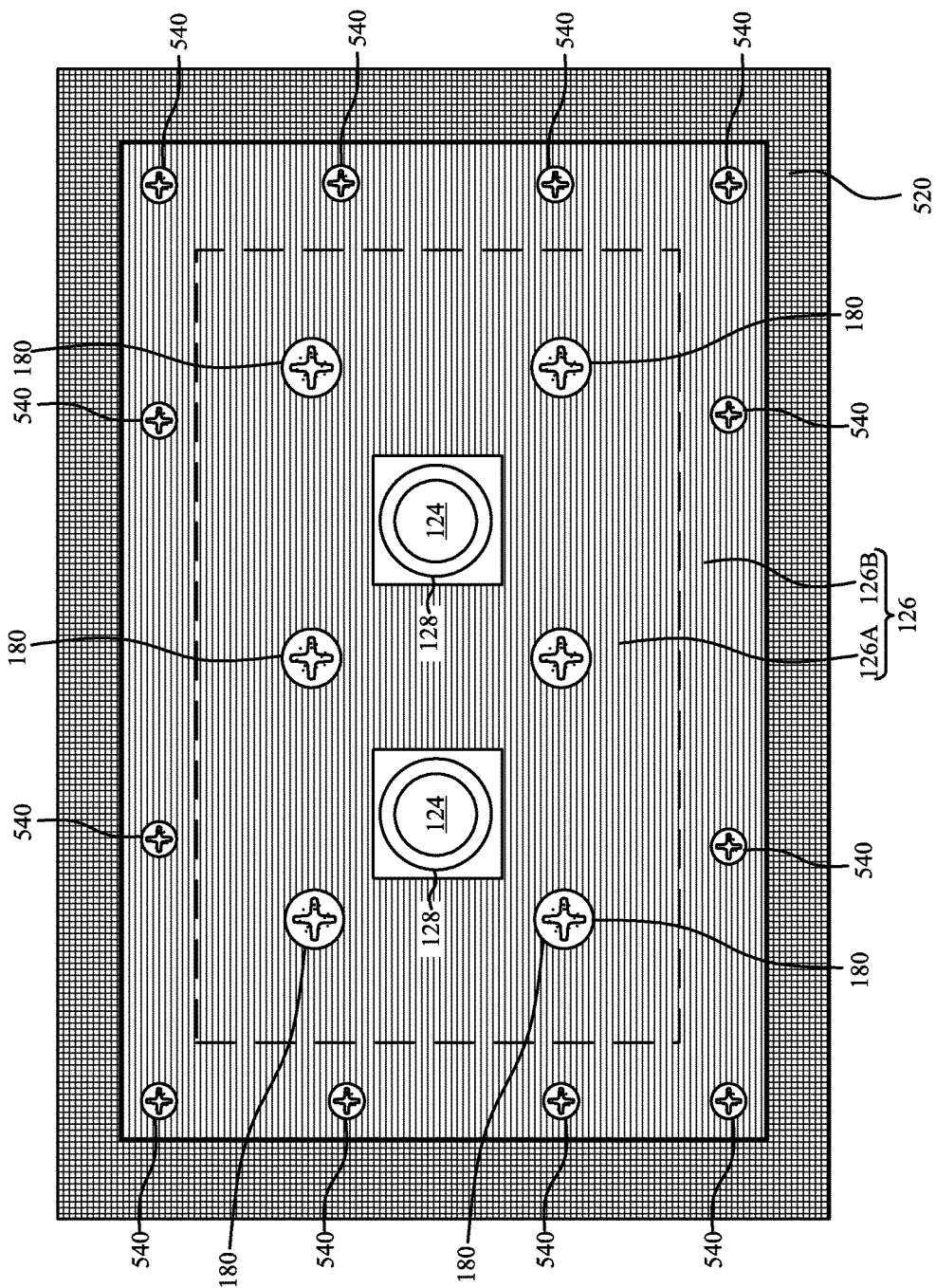
FIG. 5B is a bottom view of the probe card in FIG. 5A, in accordance with various embodiments of the present disclosure.

FIG. 5A is a cross-sectional view of a probe card 500 in accordance with various embodiments of the present disclosure. FIG. 5B is a bottom view of the probe card 500 in FIG. 5A, in accordance with various embodiments of the present disclosure. Compared with the probe card 100, the probe card 500 further includes a jig 520 and fixed parts 540. The jig 520 is configured to support the fixture 130. For illustration, as shown both in FIG. 5A and FIG. 5B, the spacer 126 includes first portions 126A and second portions 126B. The first portions 126A of the spacer 126 are closer to the housing 122 than the second portions 126B of the spacer 126. The first portions 126A of the spacer 126, the first portions 130A of the fixture 130 are secured onto the circuit board 110 through the fixed parts 180. The second portions 126B of the spacer 126 and the jig 520 are secured onto the circuit board 110 through the fixed parts 540. In some embodiments, the fixed parts 540 include screws. In some other embodiments, the fixed parts 540 include clamps.

Explained in different ways with reference to the FIG. 1A and FIG. 5A, the probe head 120 is further installed to the circuit board 110 through the second portions 126B of the spacer 126, the jig 520 and the fixed parts 540. The housing 122 is firmly secured onto the substrate 140 though the first portions 126A of the spacer 126, the fixture 130 and the fixed parts 180. The situation of the pin 124 randomly shifts away is prevented. With such a configuration, during a testing procedure, the probe head 120 is firmly pressed against the circuit board 110 by the fixed parts 180 and 540. As a result, the testing stability of the probe card 500 is improved, and errors occurred in the testing procedure are reduced. Moreover, the quality of the probe card 500 is maintained at a certain level after long test time. Further, the probe card 500 is manufactured by assembling. Thus, it is convenient to maintain or replace parts in the probe card 500.

The arrangement and the quantity of the jigs 520 and fixed parts 540 in FIG. 5A are given for illustrative purposes. Various arrangements and quantities are within the contemplated scope of the present disclosure.

In some embodiments, an apparatus is disclosed that includes a circuit board, a housing, a spacer and a pin. The circuit board is configured to test a device-under-test (DUT). The housing includes a raised portion and a supporting portion. The spacer is mounted on the supporting portion of the housing. The pin penetrates through the raised portion and the supporting portion of the housing, and is configured to electrically connect the circuit board to the DUT.

Also disclosed is an apparatus that includes a circuit board, a housing, a spacer, a fixture, a jig, a first fixed part and a second fixed part. The housing is disposed on the circuit board, and includes a raised portion and through-holes passing through the raised portion. The spacer includes a first portion and a second portion. The first portion of the spacer is closer to the through-holes than the second portion of the spacer. The fixture is disposed between the spacer and the circuit board. The jig is disposed between the spacer and the circuit board. The first fixed part secures the first portion of the spacer and the fixture to the circuit board. The second fixed part secures the second portion of the spacer and the jig to the circuit board.

Also disclosed is a method that includes operations below. A pin is disposed in a through-hole passing through a raised portion and a supporting portion of a housing. A spacer is disposed onto the supporting portion of the housing. A fixture is disposed between a circuit board and the spacer. The spacer and the fixture are secured to the circuit board by a first fixed part.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising:
a circuit board configured to test a device-under-test (DUT);
a housing comprising a raised portion and a supporting portion, wherein the raised portion and the supporting portion are connected together without a gap therebetween;
a spacer mounted on the supporting portion of the housing;
a pin penetrating through the raised portion and the supporting portion of the housing, wherein the pin is configured to couple the circuit board to the DUT, and the raised portion is extended from the supporting portion to beyond a surface of the spacer in a direction toward the DUT;
a fixture disposed between the circuit board and the spacer, the fixture comprising a first portion and a second portion;
a first fixed part securing the spacer and the first portion of the fixture to the circuit board;
a substrate connecting the pin to the circuit board, wherein the supporting portion of the housing and the second portion of the fixture are sandwiched between the spacer and the substrate; and
a first interposer configured to couple the substrate to the circuit board.

2. The apparatus of claim 1, wherein a length of the pin is about 2 millimeters to about 3 millimeters, and the length of the pin is substantially the same as a height of the housing.

3. The apparatus of claim 1, wherein the pin comprises:
a stopper configured to prevent the pin departing from the housing, wherein a thickness of the stopper is larger than about 100 micrometers; and
a plunger comprising
a first portion coupled to the stopper, wherein a diameter of the stopper is longer than the diameter of the first portion of the plunger by about 50 micrometers; and
a second portion configured to be coupled to the DUT, wherein the diameter of the first portion of the plunger is longer than the diameter of the second portion of the plunger by about 30 micrometers.

4. The apparatus of claim 1, further comprising:
a jig supporting the spacer; and
a second fixed part securing the spacer and the jig to the circuit board.

5. An apparatus, comprising:
a circuit board;
a housing disposed on the circuit board, the housing comprising:
a raised portion; and
a plurality of through-holes passing through the raised portion;
a spacer comprising a first portion and a second portion, the first portion being closer to the through holes than the second portion;
a fixture disposed between the spacer and the circuit board;
a jig disposed between the spacer and the circuit board;
a first fixed part penetrating through the first portion of the spacer and the fixture to the circuit board, to secure the first portion of the spacer and the fixture to the circuit board; and
a second fixed part penetrating through the second portion of the spacer and the jig to the circuit board, to secure the second portion of the spacer and the jig to the circuit board,
wherein the first fixed part and the second fixed part are arranged at a same side in a direction from a longitudinal axis of the through-holes.

6. The apparatus of the claim 5, wherein the further comprises:
a plurality of pins disposed in the through-holes and configured to couple the circuit board to the semiconductor device.

7. The apparatus of the claim 6, wherein a length of the pins is about 2 millimeters to about 3 millimeters.

8. The apparatus of the claim 6, further comprising:
a substrate connected to the pins, wherein the housing and the fixture are sandwiched between the spacer and the substrate; and
an interposer configured to couple the substrate to the circuit board.

9. The apparatus of the claim 6, wherein each of the pins comprises:
a stopper configured to prevent the pins departing from the housing, wherein a thickness of the stopper is larger than about 100 micrometers; and
a plunger comprising
a first portion coupled to the stopper, wherein a diameter of the stopper is longer than the diameter of the first portion of the plunger by about 50 micrometers; and
a second portion configured to extend from the housing to couple the semiconductor device, wherein the diameter of the first portion of the plunger is longer than the diameter of the second portion of the plunger by about 30 micrometers.

10. The apparatus of the claim 5, wherein the housing is made of one-piece material.

11. The apparatus of claim 1, wherein the apparatus further comprises:
a second interposer configured to couple the substrate to the circuit board, and aligned in parallel with the first interposer.

12. The apparatus of claim 11, wherein the apparatus further comprises:
a membrane configured to keep the first interposer and the second interposer being in the parallel alignment.

13. The apparatus of claim 8, further comprising:
a membrane configured to keep an alignment of the interposer.

14. The apparatus of claim 1, wherein the substrate comprises a plurality of sub-areas, and one of the sub-areas is configured to test the DUT.

15. The apparatus of claim 8, wherein the substrate comprises a plurality of sub-areas, and each of the sub-areas is configured to test a device-under-test (DUT).

16. The apparatus of claim 3, wherein the housing further comprises a through-hole passing through the raised portion, the through-hole comprises a first portion and a second portion, and a diameter of the second portion of the through-hole is smaller than a diameter of the first portion of the through-hole, and the stopper is configured to contact a boundary between the first portion and the second portion of the through-hole.

17. The apparatus of claim 9, wherein one of the through-holes comprises a first portion and a second portion, and a diameter of the second portion of the through-hole is smaller than a diameter of the first portion of the through-hole, and the stopper is configured to contact a boundary between the first portion and the second portion of the one of the through-holes.

18. An apparatus, comprising:
a circuit board configured to test a device-under-test (DUT);
a housing comprising a raised portion and a supporting portion, wherein the raised portion and the supporting portion are connected together without a gap therebetween;
a spacer, wherein the supporting portion of the housing is disposed between the spacer and the circuit board and is secured onto the circuit board by the spacer; and
a pin penetrating through the raised portion and the supporting portion of the housing;
wherein the raised portion is extended outwardly from the supporting portion in a direction toward the DUT, in order to hold the pin that is configured to couple the circuit board to the DUT;
wherein the pin comprises:
a stopper configured to prevent the pin departing from the housing, wherein a thickness of the stopper is larger than about 100 micrometers; and
a plunger comprising:
a first portion coupled to the stopper, wherein a diameter of the stopper is longer than the diameter of the first portion of the plunger by about 50 micrometers; and
a second portion configured to be coupled to the DUT, wherein the diameter of the first portion of the plunger is longer than the diameter of the second portion of the plunger by about 30 micrometers.

19. The apparatus of claim 18, wherein the housing further comprises a through-hole passing through the raised portion, the through-hole comprises a first portion and a second portion, and a diameter of the second portion of the through-hole is smaller than a diameter of the first portion of the through-hole, and the stopper is configured to contact a boundary between the first portion and the second portion of the through-hole.

20. The apparatus of claim 18, wherein the housing is made of one-piece material.

* * * * *